United States Patent [19]

Metzger et al.

[11] Patent Number: 4,678,531

[45] Date of Patent: Jul. 7, 1987

[54] METHOD AND APPARATUS FOR SCREEN PRINTING SOLDER PASTE ONTO A SUBSTRATE WITH DEVICE PREMOUNTED THEREON

[75] Inventors: David B. Metzger; Glenn S. Johnson, both of Kokomo; Michael D. Bramel, Summitville, all of Ind.

[73] Assignee: General Motors Corporation, Detroit, Mich.

[21] Appl. No.: 843,030

[22] Filed: Mar. 24, 1986

[51] Int. Cl.⁴ .................. B32B 31/12; B05C 17/06; B05D 5/12
[52] U.S. Cl. .................................. 156/250; 118/504; 156/252; 427/96; 427/282
[58] Field of Search .................. 427/272, 282, 96; 118/504, 505; 156/252, 250

[56] References Cited

PUBLICATIONS

Balents, L. M., "A Metal Mask... Thereon", RCA TN No. 978, Sep. 1974, pp. 1-2.

*Primary Examiner*—Evan K. Lawrence
*Attorney, Agent, or Firm*—Robert J. Wallace

[57] ABSTRACT

A printing screen for screen printing fabrication substances such as solder paste has an aperture formed therein so that the screen may be placed on a substrate surface with a pre-mounted device extending through the aperture. A metal cap is bonded to the screen over the pre-mounted device to protect the device against damage during a subsequent screen printing operation. Different elements may, therefore, be bonded to a substrate in completely independent steps without the need for fluxing operations in later bonding operations.

10 Claims, 2 Drawing Figures

METHOD AND APPARATUS FOR SCREEN PRINTING SOLDER PASTE ONTO A SUBSTRATE WITH DEVICE PREMOUNTED THEREON

FIELD OF THE INVENTION

This invention involves a method and apparatus for screen printing of precise patterns of conductor and/or conductive bonding substances to substrates in the process of manufacturing electrical circuit devices. The invention is directed particularly toward the screen printing of such patterns on a substrate surface to which another device having a substantial height relative to the screen thickness has previously been mounted.

BACKGROUND OF THE INVENTION

Emulsion-treated wire mesh screens are commonly used with and without metal foils to screen print conductor patterns and conductive bonding substance patterns on the surfaces of ceramic and other substrates in the process of manufacturing electrical circuit devices. In the typical screen printing process, the screen is treated with an emulsion to render it impervious to the through-flow of the printing substance. The emulsion is dried and thereafter removed in preselected areas which correspond to the pattern to be printed. The screen is placed over the printing surface of the substrate and the printing substance is deposited onto the screen frame. An automatic or semiautomatic screen printing system is actuated to drive a flexible squeegee or the like across the screen thereby to push the printing substance through the areas of the screen which have been rendered pervious by emulsion removal. A very good quality print is obtainable using this method.

The typical printing operation is carried out on a substrate which is essentially free from major surface irregularities or protrusions. Under certain circumstances, however, it is desirable to perform a screen printing process after a device which is of substantial height as compared to the thickness of the printing screen has been bonded or otherwise secured to the printing surface of the substrate. Under these circumstances the printing screen cannot be placed flush against the printing surface and a satisfactory screen printing result cannot be obtained.

SUMMARY OF THE INVENTION

According to a first aspect of the present invention, a method is provided for screen printing an electrical fabrication substance such as solder paste onto a substrate surface to which a device has been previously mounted. In general, the method comprises the steps of preparing a printing screen in essentially the usual manner but, in addition, forming an aperture or hole in the screen conforming generally to the premounted device and in a location which permits the desired printing areas of the screen to be appropriately located over and in register with the substrate surface. The screen is thereafter placed over the substrate with the device extending upwardly through the aperture in the screen. Thereafter, a cap of substance-impervious material such as metal or plastic is bonded to the screen over the device and over the hole in the screen to protect the device. Finally, the step of applying the fabrication substance to the screen and to the substrate surface is carried out. This process step is generally carried out with a flexible squeegee device which flexes around and rides over the cap. The result is the printing of an accurate substance pattern on the substrate and the protection of the device against damage or dislodgement.

According to a second aspect of the invention, an apparatus is provided for performing the aforedescribed method of applying electrical fabrication substances to selected surface areas of a substrate to which a device has previously been mounted. In general the apparatus comprises a printing screen overlying the substrate surface and which has been rendered impervious to the through-flow of said substance except in one or more preselected areas which correspond to the desired printing pattern. In addition, the screen has formed therein an aperture which corresponds generally in size and precisely in location to the device on the substrate. Finally, the apparatus comprises a substance-impervious cap which is bonded to the screen over the device. The cap may be made of various materials but metal and solid non-cellular plastics are preferred.

According to a third aspect of the invention, electrical devices having various elements mounted on a common substrate may be assembled in steps; i.e., one element may be permanently mounted on the substrate by means of solder bonding, and other elements may thereafter be mounted by means of solder bonds which are printed after the mounting of the first element. Moreover, this stepwise mounting procedure may be carried out in such a way as to reduce the cost and increase the quality and locational accuracy of the electrical devices so manufactured.

In general, this is accomplished by and through a process which comprises the steps of printing a first solder pattern on a substrate, bonding a first element to the pattern, covering the element first mounted, screen printing one or more additional solder patterns on the substrate, and thereafter mounting one or more additional elements to the just-printed pattern or patterns. Because the second-printed patterns are made after the first element is solder mounted rather than with the first pattern, as is the prior art case, there is no requirement to laboriously reflux the second patterns and little or no tendency for the second elements to shift out of position in the bonding furnace.

DESCRIPTION OF THE PREFERRED EMBODIMENT

Figure 1:
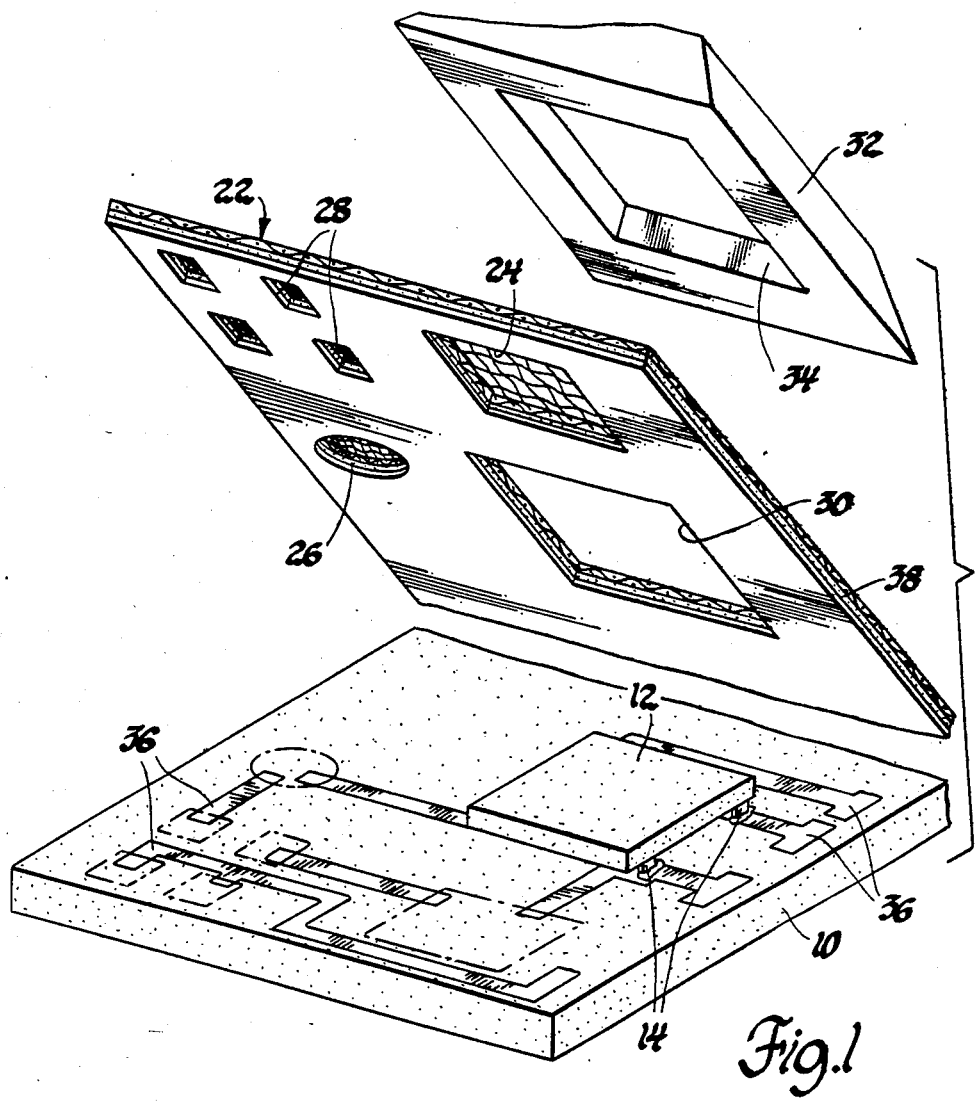
FIG. 1 is an exploded perspective view of the principal components of the apparatus aspect of the invention.

Referring to FIG. 1, a substrate 10 of inert, dimensionally stable material such as fused alumina having a low thermal coefficient of expansion has a first element in the form of a "flip chip" device 12 mounted thereon by means of conductive terminals 14 which are solder bonded in an appropriate pattern on the top surface of the substrate 10. The pattern of solder paste 36 to which device 12 is bonded was deposited on the surface of substrate 10, the device 12 applied thereto, and the combination was united in a furnace. The term "solder paste" is to be construed to mean a mixture of solder material and flux in a binder. The flux is vaporized from the mix during the heat bonding or "reflow" step of the process. The top surface of substrate 10 otherwise exhibits no patterns or protrusions of any kind but provides surface area onto which one or more additional elements may be solder bonded. If the substance 10 had been prepared according to the prior art to receive additional elements, the solder pads and/or conductors for these elements would have been printed or deposited along with the solder pattern for device 12 and would, at this stage, be fluxless as a result of the reflow step in which device 12 is permanently bonded in place. It would, therefore, be necessary to laboriously reflux these patterns, usually by hypodermic needle, before additional elements could be bonded in place.

The process herein described permits additional solder paste patterns to be screen-printed on the unused area of substrate 10 without loss of accuracy due to the presence of device 12 and without disturbing, dislocating, or wiping off the device 12.

For this purpose, a printing screen 22 is provided. The printing screen 22 comprises a network or mesh of fine wires which have been treated with an emulsion to render the screen impervious to the fabrication substance. The emulsion is thereafter removed from the screen in diagrammatically representative areas 24, 26 and 28 corresponding generally to the substrate areas where solder paste patterns are desired. Due to the removal of the emulsion, the paste can flow through the fine holes in the printing screen when the screen is placed over the top surface of the substrate 10.

The preferred screen 22 is made of crossing wires and is about 0.007 in total thickness. The emulsion adds about 0.003 in. of thickness, and a metal foil 20 is bonded to the screen 22 by way of the emulsion to give the screen greater accuracy for small and/or delicate patterns and to provide a "snap-off" effect which cleanly removes the screen from the substrate after the squeegee passes over, as hereinafter described.

In addition to the removal of the emulsion from the areas 24, 26 and 28, an aperture 30 conforming to the outline of the device 12 is cut through the screen, removing not only the emulsion, but the screen material and foil material as well. The size and shape of the aperture 30 is chosen to conform generally to the device 12 with some clearance room better shown in FIG. 2. The location of the aperture 30 is chosen so as to permit the screen 22 to be placed on the top surface of substrate 10 with the device 12 within the confines of the hole 30 and, in addition, with the patterns 24, 26 and 28 precisely in register with the areas where printing of the fabrication substance is desired.

The apparatus of FIG. 1 finally includes a smooth aluminum cap 32 having nonvertical sides so as to exhibit overall a frusto-pyramidal shape. Cap 32 is impervious to the printing substance and has formed therein a hollow or interior cavity 34 which generally conforms to and accommodates therein the device 12 when the cap 32 is placed over the device 12 and bonded onto the top surface of the printing screen 22 as shown in FIG. 2.

Figure 2:
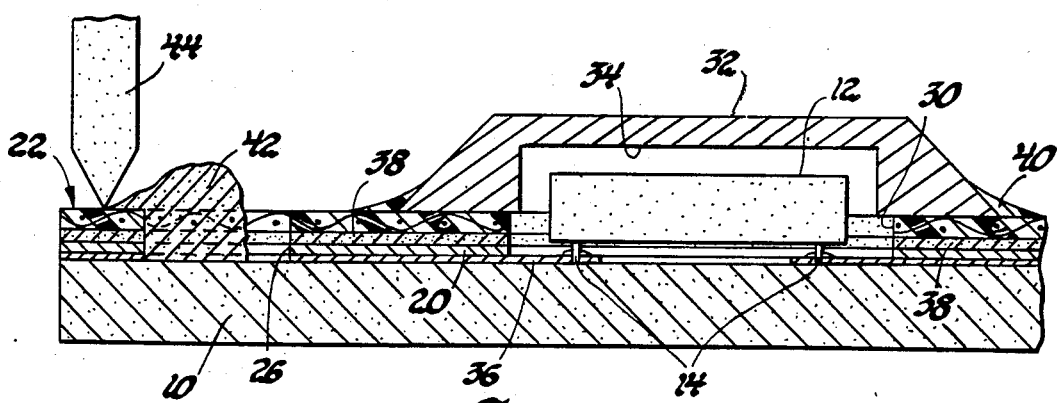
FIG. 2 is a side view in section of an apparatus embodying the invention and undergoing the process step of applying the electrical fabrication substance.

Looking to FIG. 2, the substrate 10 is shown with a conductive substance such as solder 36 preprinted on at least portions of the top surface thereof so as to permit the terminals 14 of the flip chip device 12 to be mounted. The printing screen 22 is shown diagrammatically with the emulsion layer at 38, essentially on the lower side of the screen 22. It will be understood by those skilled in the art that the emulsion actually penetrates up into the wires of the screen. Foil 20 is bonded to screen 22 by emulsion 38. Hole 26 in the emulsion 38 and foil 20 illustrates that fact that where the emulsion is removed the screen 22 is pervious to the fabrication substance so that the substance may flow through the screen when it is appropriately applied as hereinafter described.

Cap 32 is placed over the device 12, the lower surface lying flush on the screen 22. An epoxy bonding material 40 is utilized to secure the cap 32 to the screen 22, such material preferably being applied so it forms a fillet which smooths the transition between the screen 22 and the side surfaces of the cap.

FIG. 2 shows the full assembly and also illustrates a quantity of fabrication material 42, in this case solder paste, deposited on the top surface of the screen 22 and being pushed over the screen by means of a rubber squeegee 44 which is automatically or semi-automatically driven in the conventional fashion. Squeegee 44 pushes the substance 42 through the emulsion-free holes, such as 26, in the screen 22 and on to the substrate surface where a solder bond is desired. Hole 26 in the screen 22 is illustrative. Squeegee 44 is flexible to ride up over the fillet and the cap 32 preventing any damage to or inadvertent removal of the flip chip device 12 as the process is carried out.

After the printing process has been carried out, the screen 22 and the cap 32 may be removed as a unit and either reused or disassembled.

Although the method and apparatus of the present invention has been shown in the drawing and described above with reference to a discrete substrate 10, it is to be understood that the process of the invention is typically carried out with a larger substrate accommodating batch quantities of the devices 12 and the various printing patterns. The devices and the individual electrical circuit components of the substrates may thereafter be tested and trimmed and thereafter the substrate 10 is scribed by a laser beam and broken into individual devices.

In an illustrative embodiment, the screen 22 is 0.007 in. thick, the emulsion 38 is 0.003 in. thick and the foil is 0.002 in. thick for a total printing screen unit thickness of 0.012 inches. The flip-chip device 12 is about 0.002 in. high. The cap 32 is made of aluminum to a total height of 0.030 in. and the cavity 34 is 0.015 in. deep. Since cap 32 sits on the 0.012 in. screen unit, there is a vertical clearance of 0.005 in. between the cap and device 12. The cavity 32 may be stamped in; alternatively cap 34 may be molded out of plastic such as polyethylene.

Because solder paste 36 is applied and fused before paste 42, they may be of different compositions if desired.

Various modifications and additions to the embodiment described herein may be made without departing from the spirit and scope of the present invention as will be apparent to those skilled in the art.

We claim:

1. A method for screen printing an electrical fabrication substance onto a substrate surface to which a device having substantial height relative to the thickness of the printing screen has been previously mounted comprising the steps of:
   (a) preparing a printing screen to permit throughflow of said bonding substance only in one or more pre-selected areas;
   (b) forming a hole in said screen of such size and location as to conform to said device;
   (c) bonding a substance-impervious cap to the screen so as to cover said hold and said device;

(d) laying said screen over said substrate with the device being disposed within said hole;

(e) and thereafter applying said substance to the exposed surface of said screen to cause said substance to flow through said pre-selected areas.

2. The method of claim 1 wherein the step of applying said substance is carried out with a squeegee which flexes over said cap.

3. The method of claim 1 wherein the substance is solder paste.

4. Apparatus for applying an electrical fabrication substance by screen printing to selected areas of a surface of a substrate to which a device of substantial height relative to the printing screen thickness has previously been mounted comprising:

(a) a printing screen for overlying said substrate surface and which is impervious to the through-flow of said substance except in one or more pre-selected areas; said screen having an aperture formed therein to accommodate said device; and (b) a substance-impervious cap for covering said device bonded to said screen over said aperture.

5. Apparatus as defined in claim 4 wherein the cap is essentially frusto-pyramidal in shape.

6. Apparatus as defined in claim 4 further including squeegee means for applying the substance to the printing screen and to the substrate areas.

7. Apparatus as defined in claim 4 wherein the fabrication substance is solder paste.

8. Apparatus as defined in claim 4 wherein the cap is bonded to the screen with cement, the cement being applied so as to form a fillet between the screen and the cap.

9. Apparatus as defined in claim 4 wherein the cap is made of metal.

10. Appartus as defined in claim 4 wherein the device is an electrical circuit chip.

* * * * *